(12) United States Patent
Fan et al.

(10) Patent No.: US 6,784,693 B2
(45) Date of Patent: Aug. 31, 2004

(54) I/O BUFFER HAVING A PROTECTION CIRCUIT FOR HANDLING DIFFERENT VOLTAGE SUPPLY LEVELS

(75) Inventors: Renyong Fan, Cupertino, CA (US); Zhaohua Xiao, San Jose, CA (US)

(73) Assignee: Spreadtrum Communications Corporation, Sunnyvale, CA (US)

(*) Notice: Subject to any disclaimer, the term of this patent is extended or adjusted under 35 U.S.C. 154(b) by 52 days.

(21) Appl. No.: 10/374,586

(22) Filed: Feb. 24, 2003

(65) Prior Publication Data

US 2003/0169075 A1 Sep. 11, 2003

Related U.S. Application Data

(60) Provisional application No. 60/362,832, filed on Mar. 8, 2002.

(51) Int. Cl.[7] .......................................... H03K 19/0185
(52) U.S. Cl. .............................. 326/81; 326/83; 326/58
(58) Field of Search .............................. 326/26, 27, 80, 326/81, 83, 86, 56–58

(56) References Cited

U.S. PATENT DOCUMENTS

| 5,635,861 | A | * | 6/1997 | Chan et al. | ................... 326/81 |
| 6,255,850 | B1 | * | 7/2001 | Turner | ......................... 326/81 |
| 6,255,851 | B1 |  | 7/2001 | Strauss | |
| 6,388,469 | B1 | * | 5/2002 | Hunt et al. | ................... 326/81 |
| 6,414,515 | B1 | * | 7/2002 | Kunz et al. | ................... 326/81 |
| 6,483,346 | B2 | * | 11/2002 | Kunz et al. | ................... 326/81 |
| 2002/0159208 | A1 |  | 10/2002 | Ker et al. | |

* cited by examiner

*Primary Examiner*—Don Le
(74) *Attorney, Agent, or Firm*—Perkins Coie LLP

(57) ABSTRACT

An I/O buffer circuit is disclosed which includes protection circuitry to allow the I/O buffer circuit to tolerate multiple voltages. Further, the buffer circuit is adapted to have little to no leakage current. The buffer circuit includes an output portion that consists of a PMOS transistor in series with two NMOS transistors. Further, the PMOS transistor is controlled by a protection circuit that is operative to prevent leakage current.

8 Claims, 2 Drawing Sheets

I/O BUFFER HAVING A PROTECTION CIRCUIT FOR HANDLING DIFFERENT VOLTAGE SUPPLY LEVELS

RELATED APPLICATIONS

The present invention claims priority from U.S. Provisional Patent Application Ser. No. 60/362,832 filed Mar. 8, 2002 and having the same title.

TECHNICAL FIELD OF THE INVENTION

The present invention is directed towards an I/O buffer of an integrated circuit and, more particularly, to an I/O buffer that can handle multiple voltage levels.

BACKGROUND

The integrated circuit industry is continually driven to reduce costs, reduce power consumption, and improve performance. Price reduction is strongly driven by migrating products to smaller and smaller sizes, which reduce die size and increase yields. As a result, the continual scaling and shrinking of device geometries, device sizes and dimensions require that the operating voltages be similarly scaled. Operating voltages have been scaled down from 5 volts to 3.3 volts and, now, down to 1.8 volts and 1.3 volts. This has resulted in the need for mixed voltage mode systems. In other words, integrated circuits will need to interface with other integrated circuits that operate at various voltages. However, this means that the interface circuitry, typically an I/O buffer, must be able to withstand voltages that range from 1.3 volts to 5 volts.

With the scaling down of the device sizes, the transistor length and gate oxide thickness is now much smaller, thereby being more suitably adapted for low-voltage applications. However, when a high voltage is applied to such devices, the high voltages can produce an undesirable amount of stress, causing breakdown of the transistor device.

Further, many integrated circuits are now used in applications where power consumption is of great concern. Thus, the I/O circuit should protect from high voltages and have little, if any, power consumption.

DETAILED DESCRIPTION

The invention will now be described with respective areas' embodiments. The following descriptions provide specific details for thorough understanding of, and enabling description for, these embodiments of the invention. However, one skilled in the art will understand that the invention would be practiced without these details. In other instances, well-known structures and functions have not been shown or described in detail to avoid unnecessarily obscuring the description of the embodiments of the invention. For each embodiment, the same reference numbers and acronyms identify elements or acts of the same or similar functionality for ease of understanding and convenience.

The circuit described herein provides an I/O buffer that can handle various different voltage supplies. In particular, the I/O buffer must be able to meet reliability constraints of a 5 volt, 3.3 volt, 1.8 volt, or 1.3 volt interface with a transistor that has a thin gate oxide.

Figure 1:
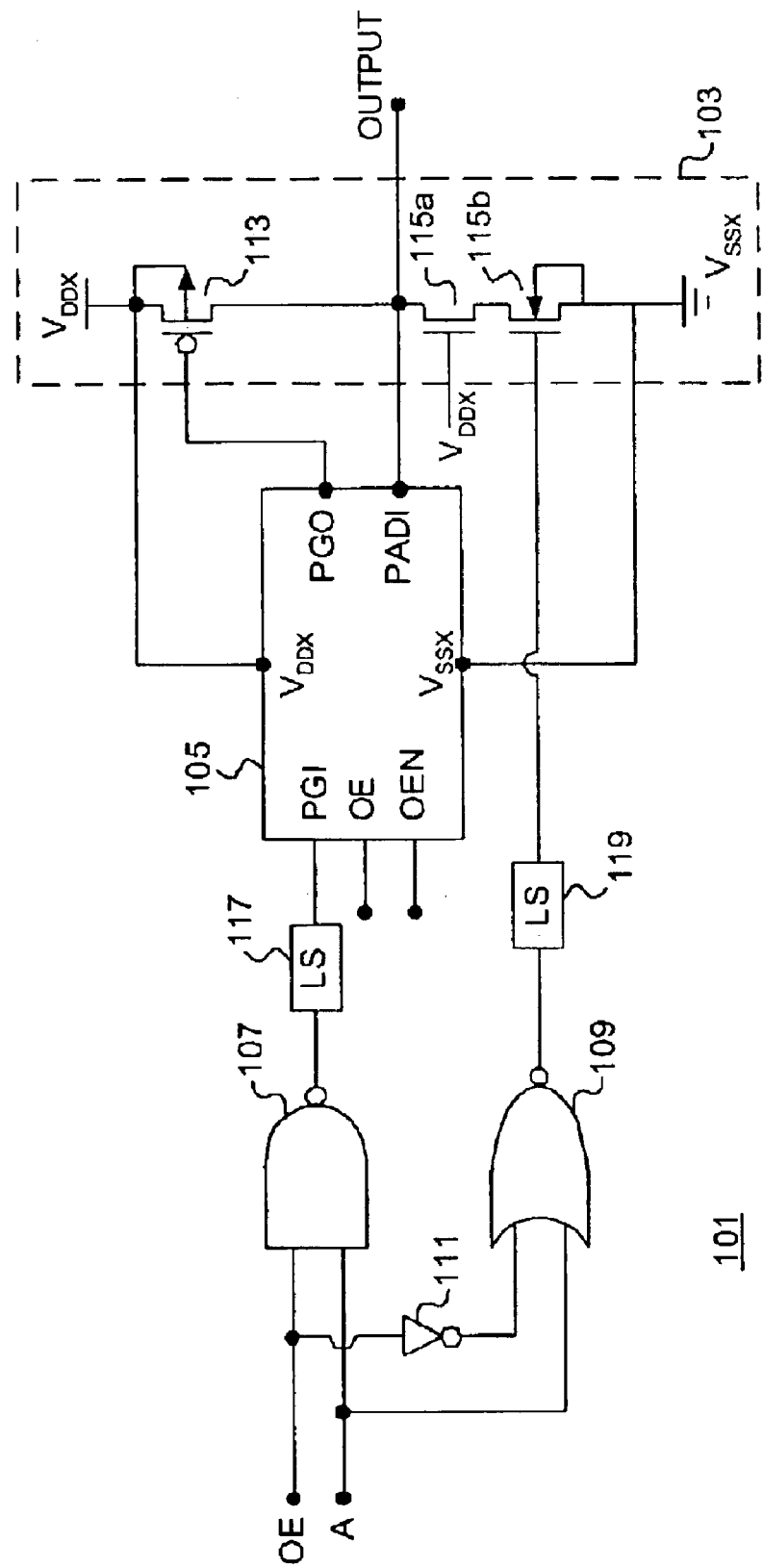
FIG. 1 is a schematic diagram of an I/O buffer formed in accordance with the present invention.

Specifically, turning to FIG. 1, an I/O buffer circuit 101 is shown. The I/0 buffer circuit 101 shown in FIG. 1 is primarily used for outputting of signals and includes an output portion 103. The output portion 103 includes a PMOS transistor 113 connected in series to a supply voltage $V_{ddx}$. The output portion 103 also includes two NMOS transistors 115a and 115b connected in series with the PMOS transistor 113 and between a ground voltage $V_{ssx}$. The node between the PMOS transistor 113 and the NMOS transistor 115a is the output pad. Note that the NMOS transistor 115a is primary provided for voltage protection purposes in the situation of a high voltage on the output pad.

The designation $V_{ssx}$ and $V_{ddx}$ refers to the "external" voltages that are required on the output pad. For example, the input portion of the buffer circuit 101 may operate on 1.5V or 1.8V as the "$V_{dd}$" or high; however, the buffer circuit 101 may be required to drive a 3.3V or 5.0V signal onto the output pad, thus the need for $V_{ddx}$. Alternatively, various "external" high voltage signals may be placed onto the output pad that must be dealt with.

Further, the I/O buffer circuit 101 includes a protection circuit 105, a NAND gate 107, a NOR gate 109, an inverter 111, and two level shifters 117 and 119. Two inputs are provided to the buffer circuit 101: the input signal to the circuit (A) and an output enable signal (OE). The signal A is the signal that is to be output by the buffer circuit 101. In one embodiment, the signal A may have a "high" value of 1.5 or 1.8 volts. The OE signal indicates that the buffer circuit 101 should be active and be processing the signal A. A third signal OEN is derived from the OE signal. The OEN signal is simply the inverse of the OE signal.

The signal A and the inverted version of OE (through the use of inverter 111) are provided as inputs to the NOR gate 109. Thus, the NOR gate 109 will output a "high" or "one" only when both the signal A is low and signal OE is high (or when the OEN signal is low). In all other combinations, the output of the NOR gate 109 is "low" or "zero". It can be appreciated that other equivalent circuits may be used to perform the same logic function.

The output of the NOR gate 109 is then provided to level shifter 119, which is operative to upshift a high signal A from the nominal high A level to the nominal high external voltage. For example, if a "high" signal A is 1.5 volts, then the level shifter will shift that voltage to 3.3V or 5.0V, depending upon upon the specific application. Because the output of the level shifter 119 is provided to control the gate of the NMOS transistor 115, the output of buffer circuit 101 is low when signal A is low and the OE signal is high.

The inputs to the NAND gate 107 are signal A and the OE signal. The output of the NAND gate is low only when signal A is high and the OE signal is high. In all other combinations, the output of the NAND gate 107 is high. The output of the NAND gate 107 is provided to level shifter 117, which also upshifts the voltage levels to the "external" high voltage. It can be appreciated that other equivalent circuits may be used to perform the same logic function. The output of the level shifter 117 is then provided as an input (referred to as PGI) to the protection circuit 105.

Further, the protection circuit 105 also uses input signals OE and OEN. The low and high voltage rails, $V_{ddx}$ and $V_{ssx}$ are also provided to the protection circuit 105. Additionally, the output pad of the output portion 103 is provided as input PADI to the protection circuit 105.

Figure 2:
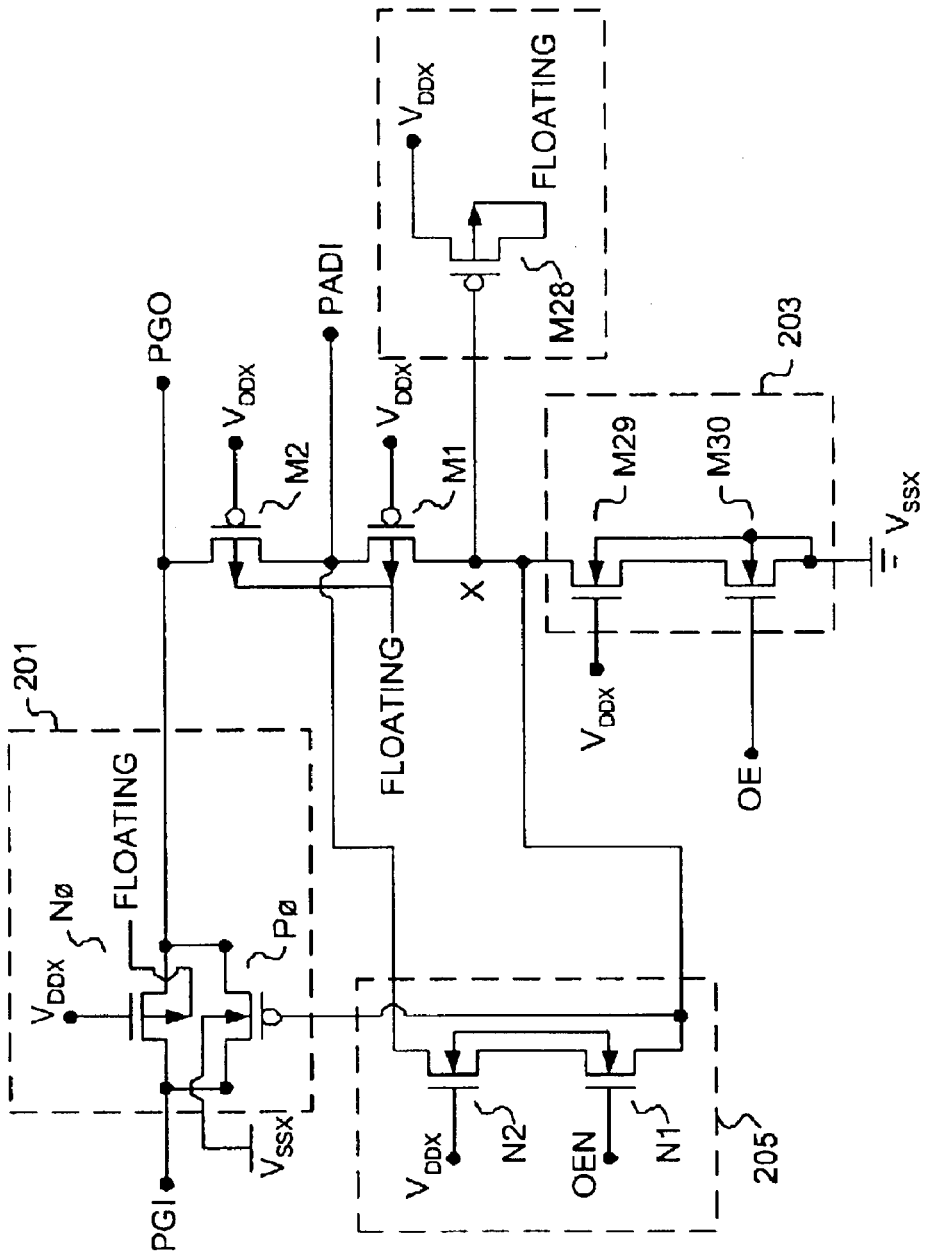
FIG. 2 is a detailed schematic diagram of a portion of the circuit shown in FIG. 1.

Turning to FIG. 2, the protection circuit 105 is shown in detail in FIG. 2 and includes an arrangement of PMOS and NMOS transistors. To simplify the description, certain singletons or groups of transistors will be grouped together to describe their functionality.

For example, PMOS transistor M28 has its gate connected to a node X between transistors M1 and M29. Note that M28 is configured to act as a capacitor. Therefore, the function of transistor M28 is to act as a high-frequency filter of signals between M1 and M29, which is helpful for minimizing the effect of glitches. Thus, transistor M28 is not strictly required to implement the protection circuit 105, but nevertheless provides advantageous filtering.

Further, transistors N0 and P0 are configured as a pass gate 201. The pass gate 201 controls whether or not the signal PGO will follow the signal PGI. Note that the pass gate 201 uses the NMOS N0 and PMOS P0 in a parallel "facing" configuration. This type of configuration is often used in the art to protect and regulate the voltages being passed from the common source and common drain. The pass gate 201 is operative such that only when the transistor P0 is turned on will PGO follow PGI. Assuming PGI is high, if transistor P0 is off, even though transistor N0 is on, PGO will not follow PGI, since there is a voltage drop across transistor N0 which is equal to the threshold voltage of N0. In some embodiments, the threshold voltage of N0 may by 0.7 V or 0.45 V. If transistor P0 is turned on, then there is no voltage drop across the transistor P0 and PGO is substantially the same as PGI.

As seen in FIG. 2, the gate of P0 is controlled by the voltage on node X. The voltage on node X is in turn determined in large part by the state of the control section 203, which consists of transistors M29 and M30. Because the gate of transistor M29 is connected to $V_{ddx}$, transistor M29 is always on. However, transistor M30 is controlled by the OE signal, which is normally high when the buffer circuit 141 is actively processing signal A. Therefore, node X will be held at $V_{ssx}$, which is normally ground in many applications. This in turn results in transistor P0 (and the pass gate 201) to be conductive, allowing signal PGI to "pass through" to PGO. Note that the control section 203 also includes the transistor M29, which is not superfluous. The purpose of this transistor is to protect the control section 203 from large voltage drops between node X and $V_{ssx}$, which may breakdown the gate oxide of a single transistor, particularly the ultra-thin gate oxides of advanced process transistors.

A second control section 205 comprises transistors N1 and N2. The second control section 205 is similar to the first control section 203, except that one of the transistors (N1) is controlled by the OEN signal. When the OEN signal is high (i.e. the OE signal is low), the voltage on node X will move from $V_{ss}$ to the voltage on PADI. This will result in the pass gate 201 turning off, disengaging PGO from following PGI.

The buffer circuit 101 can further be explained by examining certain signaling combinations. First, assume that signal A is low and signal OE is high. As noted above, this caused the NMOS transistor 115 of output section 103 to be turned on and the output pad to be held at $V_{ssx}$. Moreover, under such a combination, signal PGI from the NAND gate 107 is high. Further, because signal OE is high, both transistors of control section 203 are turned on, causing node X to be at $V_{ssx}$. This in turn activates transistor P0 of the pass gate 201, allowing signal PGO to follow signal PGI. In other words, PGO is high, which causes the PMOS transistor 113 of output section 103 to be turned off, again confirming that the output pad remains at $V_{ssx}$. In the situation described above, a low signal A is buffered by the buffer circuit 101 to the output pad, which also carries a low signal.

Next, assume that signal A is high and signal OE is high. This causes the NMOS transistor 115 of output section 103 to be turned off. Moreover, under such a combination, signal PGI from the NAND gate 107 is low. Further, because signal OE is high, both transistors of control section 203 are turned on, causing node X to be at $V_{ssx}$. This in turn activates transistor P0 of the pass gate 201, allowing signal PGO to follow signal PGI. In other words, PGO (following PGI) is low, which causes the PMOS of output section 103 to be turned on, causing the output pad to be at $V_{ddx}$. In the situation described above, a high signal A is buffered by the buffer circuit 101 to the output pad, which also carries a high signal.

Next, assume that signal A is low and signal OE is low. This causes the NMOS transistor 115 of output section 103 to be turned off. Moreover, under such a combination, signal PGI from the NAND gate 107 is high. Further, because signal OE is low, both transistors of second section 205 are turned on, causing the signal PADI to be placed on the gate of P0 (less one threshold voltage). Thus, node X is slightly lower in voltage than PGI, causing P0 to turn on. This results in PGO following PGI (high). Turning to FIG. 1, this will turn off the PMOS 113 and prevent leakage current. Further, even if PADI is higher than $V_{ddx}$ by more than a threshold voltage, i.e. resulting in P0 not turning on, the transistor M2 is turned on, allowing PGO to follow PADI. This still results in PMOS 113 turning off.

Finally, assume that signal A is high and signal OE is low. This causes the NMOS transistor 115 of output section 103 to be turned off. Moreover, under such a combination, signal PGI from the NAND gate 107 is high. Further, because signal OE is low, both transistors of second section 203 are turned on, causing the signal PADI to be placed on the gate of P0 (less one threshold voltage). Thus, node X is slightly lower in voltage than PGI, causing P0 to turn on. This results in PGO following PGI (high). Turning to FIG. 1, this will turn off the PMOS 113 and prevent leakage current. Further, even if PADI is higher than $V_{ddx}$ by more than a threshold voltage, i.e. resulting in P0 not turning on, the transistor M2 is turned on, allowing PGO to follow PADI. This still results in PMOS 113 turning off.

As can be seen, the control sections 203 and 205 not only ensures that the signal A is correctly buffered through to the output pad, but also provides a good level of voltage protection. Transistors M29 and N2 protect the transistors M30 and N1 for excessive voltage. Further, transistor 115a protects transistor 115b from excessive damaging voltage.

Moreover, the operation of transistors M1 and M2 are such that signals on PADI (i.e., the output pad) do not damage the circuitry nor result in unnecessary power consumption. Specifically, if the voltage on PADI is greater than $V_{ddx}$, i.e. PADI has a relatively high voltage, then this will cause transistor M2 to turn on and PGO will be substantially PADI. With PGO high, this turns off PMOS transistor 113 and prevents any current flow. Without current flow, there is no power consumption.

In short, it is important that PGO be equal to or higher than PADI to avoid leakage current. This can be seen in FIG. 1. If PGO is lower than PADI (the output pad), the PMOS transistor 113 turns on, causing undesirable current flow.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An output buffer controlled by an output enable signal and for outputting an input signal, the output buffer comprising:

an output portion comprising a PMOS output transistor and a NMOS output transistor connected in series between a high voltage rail and a low voltage rail, said output portion having an output pad located between said PMOS output transistor and said NMOS output transistor, said output pad for carrying a PADI signal;

a protection circuit providing a PGO signal to the gate of said PMOS output transistor, said protection circuit having as an input a PGI signal, said PGI signal being low when both said output enable signal and said input signal are high, said protection circuit comprising:

a) a pass gate that receives said PGI signal and selectively outputs said PGO signal;
   b) a first control section that activates said pass gate such that said PGI signal is passed through to said PGO signal when said output enable signal is high;
   c) a shorting PMOS transistor connected between said output pad and said gate of said PMOS output transistor, said shorting PMOS transistor being turned on if said output pad has a higher voltage than said high voltage rail; and wherein said NMOS output transistor is turned on only if said output enable signal is high and said input signal are low, further wherein said PMOS output transistor is turned on only when said PGO signal is low.

2. The output buffer of claim 1 wherein said output portion further includes a protection NMOS transistor between said PMOS output transistor and said NMOS output transistor.

3. The output buffer of claim 1 further including a NAND gate having its output provided as the PGI signal, said NAND gate having the output enable and input signal as its inputs, further including a NOR gate having its output controlling the gate of said NMOS output transistor, said NOR gate having the inverse of the output enable and input signal as its inputs.

4. The output buffer of claim 3 further including a first level shifter that upshifts the voltage of the signal output from said NAND gate and a second level shifter that upshifts the voltage of the signal output from said NOR gate.

5. The output buffer of claim 1 wherein said pass gate comprises a pass gate PMOS and a pass gate NMOS in parallel configuration.

6. The output buffer of claim 1 further including a second control section that deactivates said pass gate when said output enable signal is low.

7. The output buffer of claim 1 further including a filtering transistor connected to the output of said first control section.

8. A method of outputting an input signal through an output buffer comprising:

providing an output enable signal to said output buffer, said output buffer comprising:

a) an output portion that comprises a PMOS output transistor and a NMOS output transistor connected in series between a high voltage rail and a low voltage rail, said output portion having an output pad located between said PMOS output transistor and said NMOS output transistor, said output pad for carrying a PADI signal; and
   b) a protection circuit that outputs a PGO signal to the gate of said PMOS output transistor, said protection circuit having as an input a PGI signal;

providing a PGI signal that is low when both said output enable signal and said input signal are high and providing a PGI signal that is high when either said output enable signal or said input enable signal is low;

using said protection circuit to pass said PGI signal as said PGO signal to the gate of said PMOS output transistor when said output enable signal is high;

using said protection circuit to pass said PADI signal to said gate of said PMOS output transistor if said output pad has a higher voltage than said high voltage rail; and turning on said NMOS output transistor only if said output enable signal is high and said input signal are low.

* * * * *